United States Patent
Kawahara et al.

(10) Patent No.: US 6,736,894 B2
(45) Date of Patent: May 18, 2004

(54) METHOD OF MANUFACTURING COMPOUND SINGLE CRYSTAL

(75) Inventors: Takamitsu Kawahara, Kawasaki (JP); Hiroyuki Nagasawa, Tokyo (JP); Kuniaki Yagi, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 10/227,227

(22) Filed: Aug. 26, 2002

(65) Prior Publication Data

US 2003/0047129 A1 Mar. 13, 2003

(30) Foreign Application Priority Data

Aug. 27, 2001 (JP) .......................... 2001-256282

(51) Int. Cl.⁷ .............................................. C30B 25/02
(52) U.S. Cl. ................ 117/2; 117/94; 117/97; 117/101; 117/106; 117/951
(58) Field of Search ................ 117/2, 94, 97, 117/101, 106, 951

(56) References Cited

U.S. PATENT DOCUMENTS

| | | |
|---|---|---|
| 5,254,370 A | 10/1993 | Nagasawa et al. .......... 427/249 |
| 5,390,626 A | 2/1995 | Nagasawa et al. ............ 113/84 |
| 6,416,578 B1 | 7/2002 | Nakano et al. ............... 117/94 |
| 6,442,184 B1 | 8/2002 | Ota et al. |
| 2002/0014198 A1 | 2/2002 | Kawahara et al. .......... 117/105 |
| 2002/0019117 A1 | 2/2002 | Nagasawa |
| 2002/0072249 A1 | 6/2002 | Nagasawa et al. |
| 2002/0096104 A1 | 7/2002 | Yagi et al. |

FOREIGN PATENT DOCUMENTS

| | | |
|---|---|---|
| EP | 1 184 897 | 3/2002 |
| EP | 1 244 141 | 9/2002 |
| JP | 2000-156524 | 6/2000 |
| JP | 2000-178740 | 6/2000 |
| JP | 2000-183464 | 6/2000 |
| JP | 2000-331947 | 11/2000 |
| JP | 2000-353669 | 12/2000 |
| JP | 2001-68067 | 3/2001 |
| JP | 2001-117910 | 4/2001 |
| JP | 2001-160539 | 6/2001 |
| JP | 2002-164296 | 6/2002 |
| JP | 2002-184296 | 6/2002 |
| JP | 2002-313739 | 10/2002 |

OTHER PUBLICATIONS

K. Shibahara, et al., Applied Physics Letter, vol. 50, No. 26, pp. 1888–1890, "Antiphase–Domain–Free Growth of Cubic SIC on Si(100)", Jun. 1987.

*Primary Examiner*—Felisa Hiteshew
(74) *Attorney, Agent, or Firm*—Oblon, Spivak, McClelland, Maier & Neustadt, P.C.

(57) ABSTRACT

To provide a method of manufacturing compound semiconductor single crystals such as silicon carbide and gallium nitride by epitaxial growth methods, that is capable of yielding compound single crystals of comparatively low planar defect density. The method of manufacturing compound single crystals in which two or more compound single crystalline layers identical to or differing from a single crystalline substrate are sequentially epitaxially grown on the surface of said substrate. At least a portion of said substrate surface has plural undulations extending in a single direction and second and subsequent epitaxial growth is conducted after the formation of plural undulations extending in a single direction in at least a portion of the surface of the compound single crystalline layer formed proximately.

7 Claims, 5 Drawing Sheets

Background Art

Background Art

METHOD OF MANUFACTURING COMPOUND SINGLE CRYSTAL

TECHNICAL FIELD

The present invention relates to a method of manufacturing compound single crystals, including silicon carbide single crystal, that are useful as electronic materials. More particularly, the present invention relates to a method of manufacturing a compound single crystal (for example, a semiconductor) including silicon carbide single crystal having a low defect density or little crystal lattice deformation, which is advantageous in the manufacture of semiconductor devices.

BACKGROUND OF THE INVENTION

Conventionally, the growth of silicon carbide has been divided into bulk growth by sublimation and thin film formation by epitaxial growth on a substrate. Bulk growth by sublimation permits the growth of hexagonal (6H, 4H, and the like), high-temperature phase polymorphic silicon carbide and the manufacturing of substrates of silicon carbide itself. However, numerous defects (particularly micropipes) are introduced into the crystal, making it difficult to increase the area of the substrate surface. By contrast, epitaxial growth on a single crystalline substrate affords better control of the addition of impurities, an enlarged substrate surface area, and reduction in the micropipes that are problematic when employing sublimation. However, in the epitaxial growth method, there is often a problem in the form of an increased density of stacking defects due to the different lattice constants of the substrate material and silicon carbide. In particular, since the silicon that is generally employed as the growth substrate has a high level of crystal nonconformity with silicon carbide, numerous twins and antiphase boundaries (APB) appear in the silicon carbide growth layer, becoming a source of leak currents and the like and compromising characteristics of silicon carbide as electronic elements.

K. Shibahara et al. have proposed a method of growth on a silicon (001) surface substrate (see FIG. 3) in which the surface normal axis is slightly tilted (in which an off angle is introduced) from the <001> direction in the <110> direction as a method of effectively reducing antiphase boundaries (Applied Physics Letter, Vol. 50, 1987, p. 1,888). In this method, slightly tilting the substrate causes a step at the atomic level to be introduced at equal intervals in a single direction. Thus, in vapor phase growth, epitaxial growth is imparted by step flow and the propagation of planar defects in the direction perpendicular to the steps (cutting across the steps) that are introduced is inhibited. Thus, as the thickness of the silicon carbide film increases, among the two antiphase regions in the film, the antiphase region expanding in a direction parallel to the step that has been introduced expands with priority over the antiphase region expanding in the direction perpendicular thereto, and antiphase boundaries are effectively reduced. However, as shown in FIG. 4, this method increases the step density of the silicon carbide/silicon substrate boundary, causing the unintended generation of antiphase boundary 1 and twins, and has a drawback in that it does not completely eliminate antiphase boundaries. In FIG. 4, 1 denotes the antiphase boundary occurring at a single atomic step in the silicon substrate, 2 denotes the junction point of antiphase boundaries, 3 denotes the antiphase boundary occurring at a silicon substrate surface terrace, θ denotes the off angle, and φ denotes the angle (54.7°) formed between the Si (001) face and the antiphase boundary. Antiphase boundary 3 occurring at the silicon substrate surface terrace is eliminated at antiphase boundary junction point 2, but antiphase boundary 1 occurring at the single atom step in the silicon substrate has no junction and is not eliminated.

As a method of reducing such planar defects (twins, APBs) in silicon carbide, the present applicant has proposed the technique of eliminating planar defects propagating within silicon carbide by imparting undulations extending in a direction parallel to the silicon substrate surface and epitaxially growing silicon carbide on a substrate that has been processed with such undulations (Japanese Patent Application (TOKUGAN) No. 2000-365443 and Japanese Unexamined Patent Publication (KOKAI) No. 2000-178740). Imparting undulations to the silicon substrate has the effect of positioning off-tilted planes opposite each other on the silicon substrate as shown in FIG. 5. Thus, facing planar defects come together as shown in FIG. 6 and cancel each other out.

Based on this method, silicon carbide can be obtained in which planar defects are greatly reduced. However, when opposing planar defects come together and cancel out, one or the other of the planar defects remains and continues to propagate. In an actual undulated silicon substrate with an undulation interval of 2 micrometers and a silicon substrate plate thickness of 200 micrometers, for example, the remaining planar defect density is found to be a minimum of about 30/cm by simple calculation (assuming that one planar defect remains and propagates from each undulation). To completely eliminate these planar defects requires a plate thickness of 1.41 times the diameter of the silicon carbide (the thickness at which the spot at which the endmost planar defect ceases to propagate is not the growth surface). When employing vapor phase growth, the growth time required is excessive, rendering this thickness impractical.

Further, compound semiconductors other than silicon carbide, such as gallium nitride, are expected to serve as blue LEDs and power device materials. There have been numerous reports and examples of the growth of gallium nitride on silicon carbide substrates in recent years. This is because the use of silicon carbide as a base substrate in the growth of gallium nitride affords such advantages as facilitating the formation of electrodes, permitting ready heat dissipation, and facilitating handling and processing due to an identical crystal cleavage direction. However, there are problems in that it is difficult to achieve high-quality silicon carbide substrates with large surface areas, and although the difference in lattice constants is relatively small for silicon carbide, planar defects end up propagating in the gallium nitride growth layer due to boundary lattice nonconformity. Just as when growing silicon carbide on a silicon substrate, it is necessary to examine measures for eliminating defects.

The object of the present invention is to provide a method of manufacturing compound semiconductor single crystals such as silicon carbide and gallium nitride by epitaxial growth methods, that is capable of yielding compound single crystals of comparatively low planar defect density.

SUMMARY OF THE INVENTION

The present invention, which solves the above-stated problems, are as follows:
(1) A method of manufacturing compound single crystals in which two or more compound single crystalline layers identical to or differing from a single crystalline substrate are sequentially epitaxially grown on the surface of said substrate, characterized in that at least a portion of said substrate surface has plural undulations extending in a single direction and second and subsequent epitaxial growth is conducted after the formation of plural undulations extending in a single direction in at least a portion of the surface of the compound single crystalline layer formed proximately.

(2) The method of manufacturing according to (1) wherein said compound single crystalline layer is a compound single crystal differing from the single crystalline substrate, and the compound single crystal constituting the compound single crystalline layer and the single crystal constituting the single crystalline substrate have similar space lattices.

(3) The method of manufacturing according to (1) or (2) wherein the direction of the plural undulations extending on the single crystalline substrate surface and the direction of extension of the plural undulations provided on the surface of the compound single crystalline layer formed on said substrate surface are either identical or perpendicular.

(4) The method of manufacturing according to any of (1) to (3) wherein the direction of extension of the plural undulations provided on the surface of the compound single crystalline layer provided adjacently to the growth direction is identical or perpendicular.

(5) The method of manufacturing according to any of (1) to (4) wherein said single crystalline substrate is single crystalline SiC.

(6) The method of manufacturing according to any of (1) to (5) wherein said compound single crystalline layer is single crystalline SiC, gallium nitride, aluminum nitride, or aluminum gallium nitride.

(7) The method of manufacturing according to any of (1) to (6) wherein said single crystalline SiC substrate is cubic SiC in which the basal plane is the (001) face, or hexagonal SiC in which the basal plane is the (11–20) face or the (1100) face.

MODES OF IMPLEMENTING THE INVENTION

Figure 1:
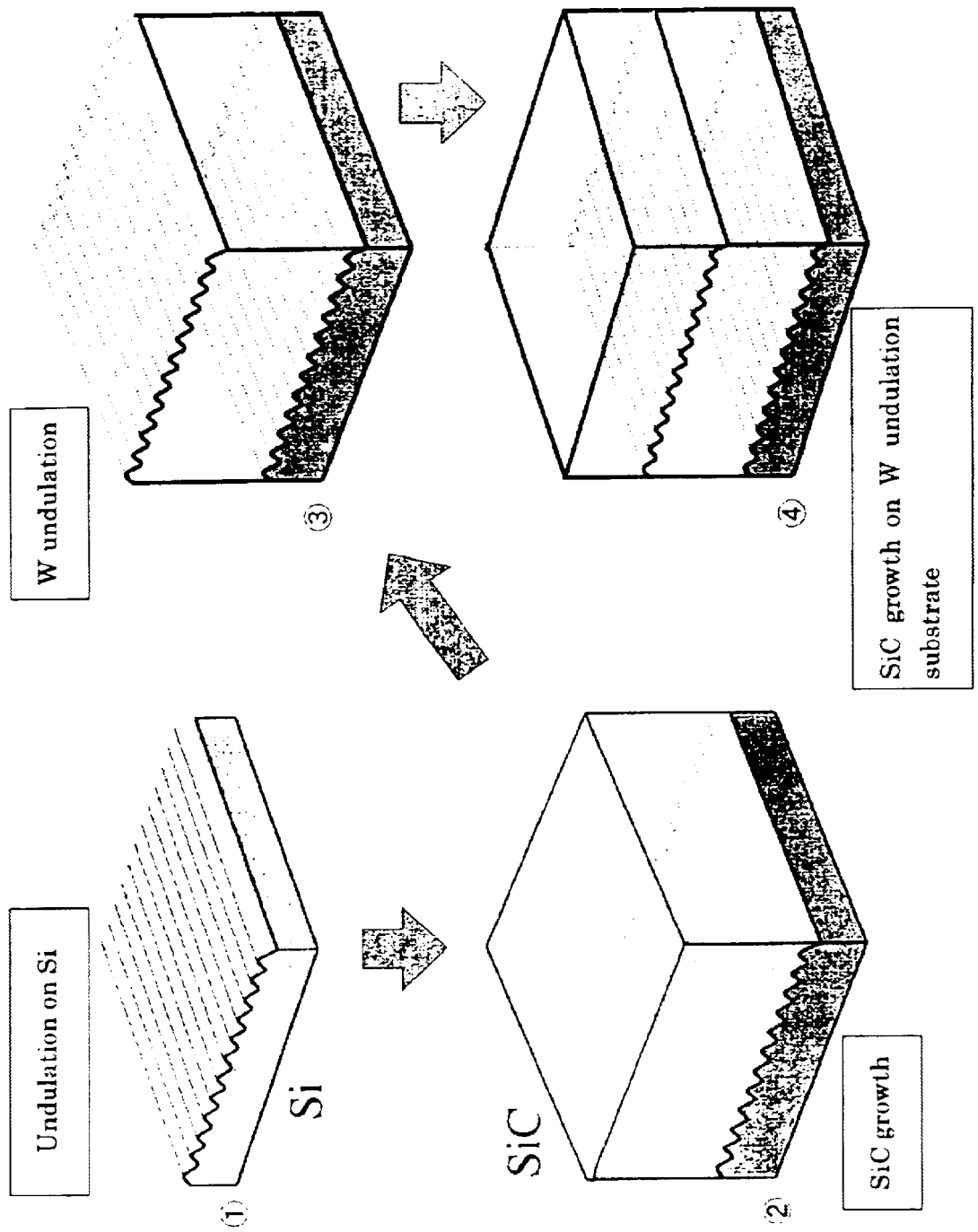
FIG. 1 shows a schematic of the manufacturing method of the present invention when the direction of extension of the plural undulations extending on the Si substrate surface is identical to the direction of extension of the plural undulations provided on the surface of a compound single crystalline layer formed on this substrate surface.

In the method of manufacturing compound single crystals of the present invention, two or more compound single crystalline layers identical to or differing from a single crystalline substrate are sequentially epitaxially grown on the surface of the substrate.

The method is characterized in that a single crystalline substrate (sometimes referred to hereinafter as an "undulation-processed single crystalline substrate) in at least a portion of the substrate's surface, plural undulations extending in a single direction have been formed is employed as substrate, and second and subsequent epitaxial growth is conducted after the formation of plural undulations extending in a single direction in at least a portion of the surface of the compound single crystalline layer formed proximately.

When single crystals are stacked on an undulation-processed single crystalline substrate, the differences in the height of the undulations are gradually eliminated, yielding a smooth mirror-finished surface on a single crystalline layer several tens of micrometers in thickness. Accordingly, the step density is low as the film thickness subsequently increases, and growth by two-dimensional nucleus generation is imparted due to low step density. When a propagational planar defect propagating from a boundary remains, it continues to propagate toward the growth surface until it meets an opposing planar defect.

In the manufacturing method of the present invention, a single crystalline layer is epitaxially grown on the surface of an undulation-processed single crystalline substrate, and this single crystalline layer surface is then again processed to impart undulation. Thus, once a polar face appearing on the basal plane of the single crystalline layer has been eliminated, step flow growth due to the off-tilt plane effect of newly formed undulations is imparted. Growth from steps in the terrace width direction becomes predominant and the propagation of planar defects from the boundary can be effectively inhibited. As a result, it is possible to reduce planar defects relative to methods in which a single crystalline layer is formed on the surface of a single crystalline substrate into which undulations have been processed. In methods in which a single crystalline layer is formed on the surface of a single crystalline substrate into which undulations have been processed, it is necessary that planar defects naturally meet and are eliminated. However, in the manufacturing method of the present invention, the defects are eliminated at an earlier stage than in prior art methods.

Single crystalline SiC is an example of a single crystal employed in a single crystalline substrate. More specifically, a single crystalline SiC substrate is either cubic SiC in which the basal plane is the (001) face, or hexagonal SiC in which the basal plane is the (11–20) face or the (1100) face. A further example of a single crystalline substrate other than those mentioned above is single crystalline Si substrate.

Examples of the crystals constituting the compound single crystalline layer are SiC, gallium nitride, aluminum nitride, aluminum gallium nitride, and indium gallium nitride.

The method of manufacturing compound single crystals of the present invention is a method of manufacturing compound single crystalline layers that are either identical to or different from the single crystalline substrate. When the compound single crystalline layer is comprised of a compound single crystal differing from the single crystalline substrate, it is particularly effective in the case where the compound single crystal constituting the compound single crystalline layer has a space lattice similar to that of the single crystal constituting the single crystalline substrate.

The statement that two single crystals have similar space lattices means that the positional relations between the atoms of the structural units of the crystals (base unit structures) are similar, the bonding orientation between atoms is identical, and they grow in the same crystal axis orientation (epitaxial growth).

Further, examples of two single crystals having similar space lattices are cubic GaN/cubic SiC, hexagonal GaN/hexagonal SiC, hexagonal AlN/hexagonal SiC, hexagonal AlGaN/hexagonal SiC, cubic AlN/cubic SiC, and hexagonal (4H) SiC/hexagonal (6H) SiC.

The undulation processing applied to the surface of the single crystalline substrate and the undulation processing applied to the surface of the single crystalline layers will be described.

The undulation applied to the surface of the single crystalline substrate and the undulation applied to the surface of the single crystalline layers consists of plural undulations extending in a single direction. These undulations are not particularly limited so long as they reduce or eliminate planar defects such as antiphase boundaries in single crystalline layers. More specifically, they are undulations capable of introducing the off-angle described by K. Shibahara et al. into the inclined surfaces of individual undulations. However, the undulations in the present invention do not require parallelism or a mirror-finished surface symmetry in a strict mathematical sense, and can be in any form adequate to effectively reduce or eliminate planar defects.

Figure 7:
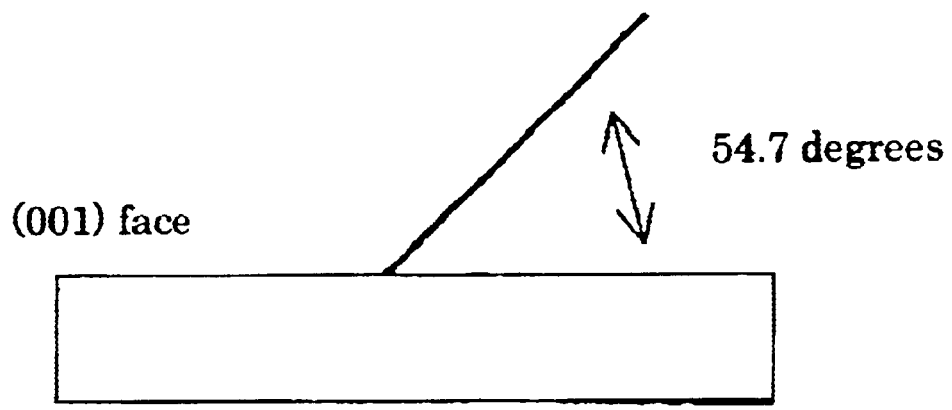
FIG. 7 is a descriptive drawing of the angle between the {111} faces, which is the plane of the defect that is to be eliminated, and the (001) face, which is the growth plane (horizontal plane) in a cubic crystalline layer.

For example, the undulations have a centerline average roughness ranging from 3 to 1,000 nm. The gradient of the slope of the inclined surface of the undulations can be an angle smaller than the angle formed between the growth substrate surface and the planar defects such as twin bands that are generated. For example, the undulations can have a slope less than or equal to the angle formed by the {111} faces, which is the defect plane to be eliminated in the cubic crystalline layer, with the (001) face, which is the growth plane (horizontal plane), that is, a slope less than or equal to 54.7°, preferably a slope ranging from 1° to 54.7° (see FIG. 7) in cubic crystal layers. Further, in the case of hexagonal crystals, they can have an angle (the angle differs with the lattice constant of the crystal) less than the angle formed by {1–101} with the growth face (0001), for example. Still further, they can have an angle less than or equal to the angle formed by the C axis (0001) with the (01–10) M face or (1–102) R face.

A number of examples have been given of growth surfaces and the planar defects that are generated. However, these are but examples and the gradient of slope is not limited to what has been set forth above. All undulations having a gradient of slope less than the angle formed by the growth surface and the planar defects generated yield an undulating effect. That is, any angle sufficient for planar defects generated by opposing inclined surfaces to collide with opposing planar defects and be eliminated is suitable.

Further, in a cross-section perpendicular to the direction of extension of the undulations, the shape of adjacent portions of inclined surfaces of the undulations may be curved.

What is meant here by the term "undulations" are not atomic steps, but undulations having repeating peaks and valleys with dimensions larger than atomic steps, described further below. Such undulations, for example, have a centerline average roughness ranging from 3 to 1,000 nm and the above-mentioned peak portions may contain inclined surfaces having slopes of 1 to 54.7° as set forth above in the case of cubic crystals. An effective off angle is readily achieved when the centerline average roughness is greater than or equal to 3 nm, and the density of planar defects generated drops. When the centerline average roughness is less than or equal to 1,000 nm, the probability of planar defects colliding and being eliminated is high. The centerline average roughness is desirably greater than or equal to 10 nm and less than or equal to 100 nm.

The centerline average roughness of the substrate surface is the centerline average roughness (Ra) defined in B0601-1982 (JIS Handbook 1990). When the measurement length L portion in the centerline direction is extracted from the roughness curve, the centerline of the extracted portion is made the X axis, the direction of longitudinal magnification is made the Y axis, and the roughness curve is denoted by y=f(x), the value denoted by the following equation is the centerline average roughness:

$$Ra = (1/L) \int^{1}_{0} f(x) |f(x)| dx$$

In the definition of JIS B0601-1982, the unit of centerline average roughness is micrometers. However, nanometers (nm) are employed in the present invention. Further, the roughness curve for obtaining centerline average roughness (Ra) is measured by atomic force microscope (AFM).

Further, the gradient of slope of the inclined surface of the undulations is desirably greater than or equal to 1° and less than or equal to 54.7°.

In the method of the present invention, the effect is achieved by promoting the growth of a compound single crystal of silicon carbide or the like near atomic level steps in the growth substrate or on the single crystalline layer surface. Thus, the present invention is realized when the gradient of slope of the undulations is such that the slope of the (111) face, the entire surface of which is covered with single steps, is less than or equal to 54.7°.

Further, at a gradient of slope of less than 1°, the step density of the inclined surface of the undulations decreases markedly. Thus, the slope of the inclined surface of the undulations is greater than or equal to 1°. Further, the angle of slope of the inclined surface of the undulations is preferably greater than or equal to 2° and less than or equal to 10°.

In the present invention, the "inclined surface of the undulations" includes all shapes, such as flat surfaces and curved surfaces. Further, in the present invention, the "gradient of slope of the inclined surface of the undulations" means the gradient of slope of an inclined surface substantially contributing to the effect of the present invention, and means the average gradient of slope of the inclined surface. The "average gradient of slope" means the angle (average value of the evaluation zone) formed between the crystal orientation plane of the substrate surface or single crystalline layer surface and the inclined surface.

Further, in the cross-section perpendicular to the direction of extension of the undulations, the shape of adjacent portions of inclined surfaces present on the substrate or the single crystalline layer surface is desirably curved. Adjacent portions of inclined surfaces means the channel portions and ridge portions of undulations extending along the surface, with the cross-sectional shape of the bottom portions of channels and top portions of ridges both being curved. The wavelength and wave height of the cross-sectional shape of undulations in the cross-section perpendicular to the direction of extension of undulations do not have to be constant, but a sinusoidal wave shape is present. When the bottom portion of the channels and the top portion of the ridges both have curved cross-sectional shapes, it is possible to reduce the planar defect density.

As set forth above, by providing plural undulations in the substrate surface and single crystalline layer surfaces, it is possible to incorporate the off-angle introduction effect described by K. Shibahara et al. in the inclined surfaces of each of the undulations. The spacing of the tops of the undulations is desirably greater than or equal to 0.01 micrometer due to limits in the microprocessing techniques in manufacturing undulations on the substrate and single crystalline layers. Further, when the spacing of the tops of the undulations exceeds 1,000 micrometers, the frequency of meeting of antiphase boundaries drops precipitously. Thus, the spacing of the tops of the undulations is desirably less than or equal to 1,000 micrometers. Further, the spacing of the tops of the undulations is desirably greater than or equal to 0.1 micrometer and less than or equal to 100 micrometers in order to achieve an adequate effect in the present invention.

The difference in height and spacing of the undulations affect the degree of slope of the undulations, that is, the step density. Since the preferred step density changes with crystal growth conditions, it cannot be given once and for all. However, the necessary difference in height of the undulations is normally almost identical to the spacing of the tops of the undulations, that is, greater than or equal to 0.01 micrometer and less than or equal to 20 micrometers. The individual undulations are formed so that inclined surfaces having a gradient of less than 90° relative to the basal plane are opposite each other, and are desirably formed so that when the angle of slope of the surface relative to the basal plane is integrated across the entire surface, the value essentially becomes 0°.

In the present invention, the entire substrate and single crystalline layer, or a partial region of the substrate and single crystalline layer (where this region comprises the above-described plural undulations) is treated as a single growth region on which a compound single crystalline film is continuously formed. Providing undulations formed in this manner on the substrate and single crystalline layer permits meeting, between the above-mentioned plural undulations, of the antiphase boundaries generated and grown for steps present on the inclined surface as the single crystalline layer grows on the substrate. Further, the introduction of undulations into the single crystalline layer eliminates polar faces appearing on the basal plane once and imparts step flow growth due to the effect of the off-inclined surface of the newly formed undulations. Thus, it is possible to effectively eliminate antiphase boundaries and obtain a compound single crystal with few defects.

The use of an off-cutting method is conceivable for forming off-inclined surfaces on the growth substrate surface (for example, the cubic silicon carbide (001) face). However, to achieve an off-inclined surface with a maximum off effect of 4°, the minimum plate thickness of 10.5 mm or more is required in the case the substrate 6 inches in diameter is used. If a plate of 10.5 mm in plate thickness cannot be obtained, a six-inch area region cannot be achieved even when cutting to 4°. Since a machining allowance is required when actually cutting, a thickness of 12–20 mm would become necessary. However, the processing of undulations permits the formation of off-inclined surfaces opposing 3C—SiC surfaces several micrometers in thickness, permitting the introduction of step flow mode epitaxial growth.

Undulations having the above described shapes can be formed in the surface of the substrate and single crystalline layers, for example, by photolithographic techniques, press processing techniques, laser processing and ultrasound processing techniques, and processing by grinding. No matter which method is employed, it suffices for the final form of the growth substrate surface and single crystalline layer to have a shape adequate for the effective reduction or elimination of antiphase boundaries.

When employing photolithographic techniques, it is possible to transfer any shape of undulation to the growth substrate or single crystalline layer by forming a desired mask pattern transferred on the substrate or single crystalline layer. For example, the line width of the pattern can be changed to control the width of the undulation shape. The etching selection ratio of the resist and the substrate or the single crystalline layer can be controlled to regulate the depth of the undulation pattern and angle of the inclined surface. When forming a substrate on which the shapes of adjacent portions of inclined surfaces are curved in the cross-section perpendicular to the direction of extension of the undulations on the substrate or single crystalline layer surface, after transferring a pattern to the resist, the resist can be softened by heat treatment to form an undulation pattern of curved (wavy) cross section.

When employing press processing techniques, the press mold can be shaped to yield any desired shape of undulation on the growth substrate or single crystalline layer. Molds of various shape can be formed to form various shapes of undulation on the growth substrate.

When employing laser processing or ultrasound processing techniques, minute processing is possible because the undulation shape is directly formed on the substrate or single crystalline layer.

When employing processing by grinding, the abrasive particle size employed in grinding and the processing pressure can be varied to control the width and depth of the undulation shape. When manufacturing a substrate or single crystalline layer with an undulation shape in a single direction, grinding is conducted in just a single direction.

When employing processing by dry etching, the etching conditions and shape of the etching mask can be changed to control the width and depth of the undulation shape. When forming a substrate in which the shape of adjacent portions of inclined surfaces are curved in the cross-section perpendicular to the direction of extension of the undulations on the substrate or single crystalline layer surface, the etching mask can be positioned away from the substrate on which patterns are transferred to transfer a wavy pattern of curved cross-section due to the etching being diffused between the mask and the substrate or single crystalline layer. Further, a mask having a window cross-section of pedestal shape widening toward the substrate on which patterns are transferred may also be employed.

In the manufacturing method of the present invention, conducted at least once are the formation of undulations on the single crystalline layer surface and the formation of a new single crystalline layer on the single crystalline layer on which undulations have been formed. The formation of undulations on the single crystalline layer surface and the formation of a new single crystalline layer may be repeated two or more times; for example, from 2 to 10 times. However, when necessary, this may be conducted more than ten times.

In the manufacturing method of the present invention, the direction in which the plural undulations extend on the surface of the single crystalline substrate and the direction in which the plural undulations extend on the surface of the compound single crystalline layer formed on the substrate surface may be identical or perpendicular. Further, the direction in which the plural undulations extend on the surface of a given single crystalline layer and the direction in which the plural undulations extend on the surface of a compound single crystalline layer formed on the surface of that single crystalline layer may be identical or perpendicular.

FIG. 1 shows the case where the direction in which the plural undulations extend on an Si substrate surface is identical to the direction in which the plural undulations extend on the surface of a compound single crystalline layer formed on that substrate surface. In this method, plural undulations extending on the Si substrate surface are formed in (1), a compound single crystalline layer is formed on the substrate surface in (2), plural undulations are imparted to the surface of the compound single crystalline layer (the direction of extension of these undulations being identical to the direction of extension of the undulations on the Si substrate surface) in (3), and another compound single crystalline layer is formed in (4).

Figure 2:
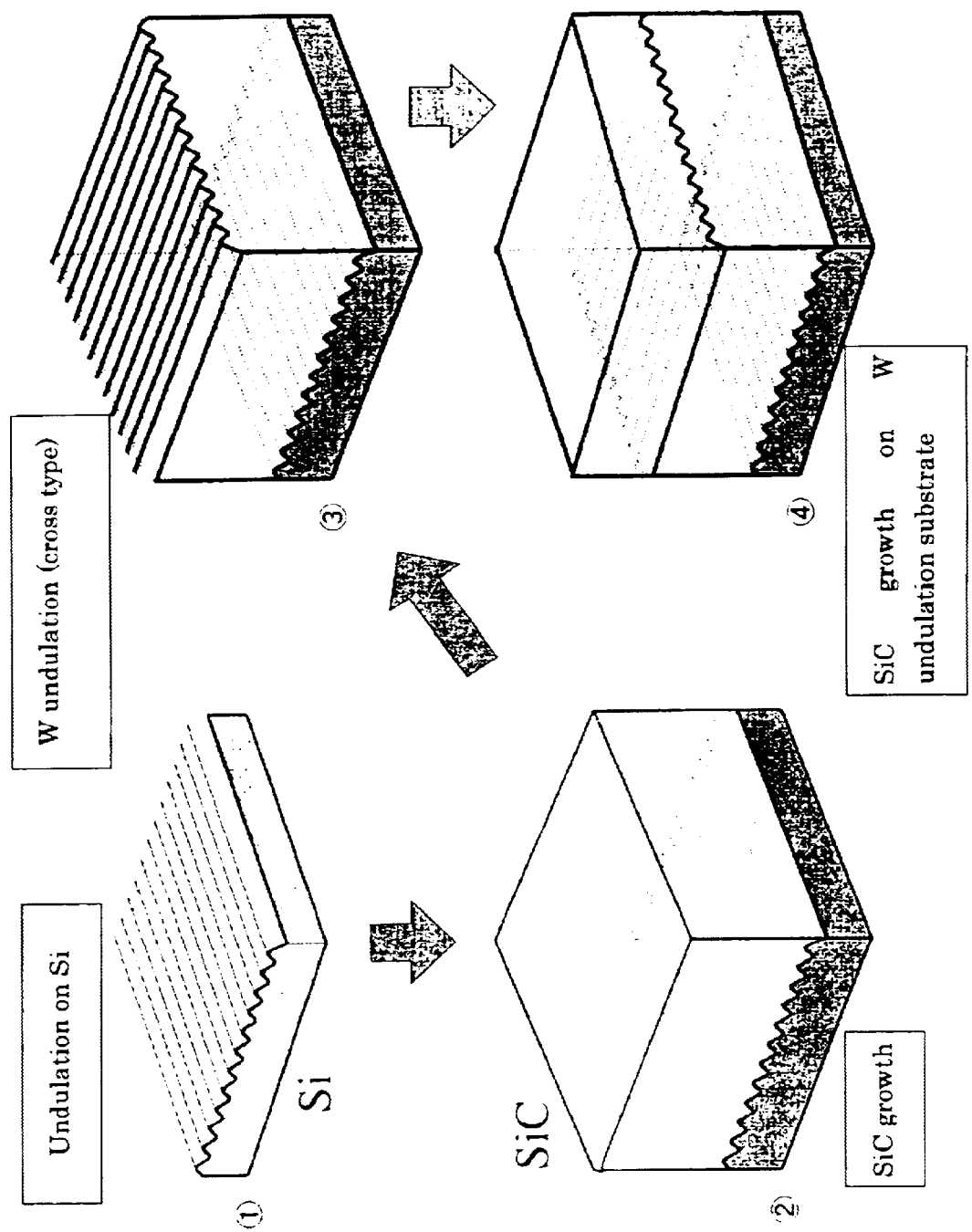
FIG. 2 shows a schematic of the manufacturing method of the present invention when the direction of extension of the plural undulations on the Si substrate surface is perpendicular to the direction of extension of plural undulations provided on the surface of a compound single crystalline layer formed on this substrate surface.
Figure 3:
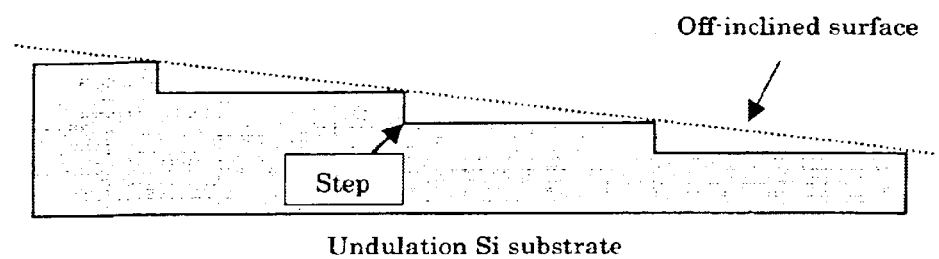
FIG. 3 is a schematic diagram of a tilted (imparted with an off-angle) silicon (001) surface substrate.
Figure 4:
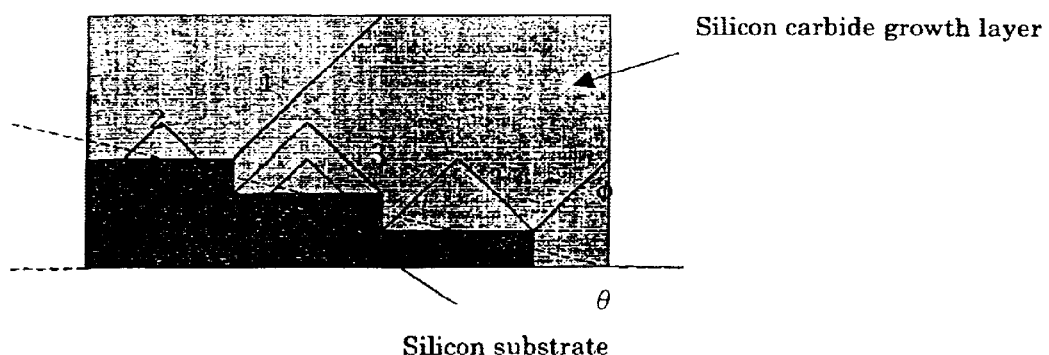
FIG. 4 is a descriptive drawing of the conventional method of imparting a slight tilt to the substrate.
Figure 5:
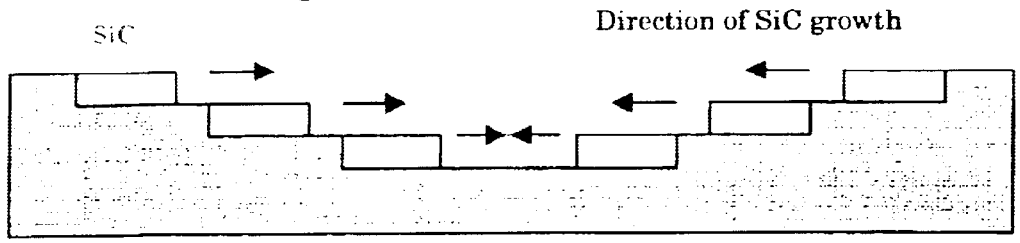
FIG. 5 is a descriptive drawing of how planar defects propagating in silicon carbide are eliminated in a method of epitaxially growing silicon carbide on a substrate in which off-inclined surfaces are opposed.
Figure 6:
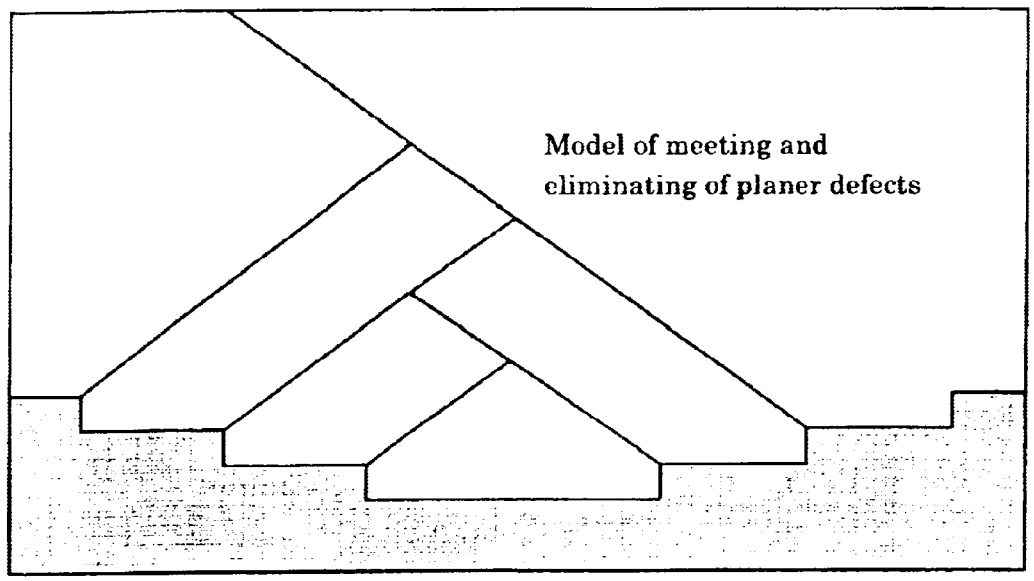
FIG. 6 is a descriptive drawing of how planar defects propagating in silicon carbide are eliminated (opposing planar defects meet and cancel out) in a method of epitaxially growing silicon carbide on a substrate that has been processed to impart undulations and in which off-inclined surfaces are mutually opposed.

FIG. 2 shows the case where the direction in which the plural undulations extend on an Si substrate surface is perpendicular to the direction in which the plural undulations extend on the surface of a compound single crystalline layer formed on that substrate surface. In this method, plural undulations extending on the Si substrate surface are formed in (1), a compound single crystalline layer is formed on the substrate surface in (2), plural undulations are imparted to the surface of the compound single crystalline layer (the direction of extension of these undulations being perpendicular to the direction of extension of the undulations on the Si substrate surface) in (3), and another compound single crystalline layer is formed in (4).

For example, when the orientation of undulations formed on the surface of the $n^{th}$ layer in the form of the substrate or a single crystalline layer are identical to the orientation of the undulations formed on the surface of the $n+1^{th}$ single crystalline layer and the polar face of the crystals of the nth layer is oriented in an orientation identical to the orientation of a polar face having the same polarity as the crystals of the $n+1^{th}$ layer, the effect is such that defects propagating from the $n^{th}$ crystalline layer to the $n+1^{th}$ layer are inhibited by actively implementing step flow growth.

Further, it is possible for the orientation of undulations formed on the surface of the $n^{th}$ layer in the form of the substrate or a single crystalline layer to be identical to the orientation of undulations formed on the surface of the $n+1^{th}$ single crystalline layer and for the orientation of the undulations formed on the surface of the $n+1^{th}$ single crystalline layer to be perpendicular to the orientation of undulations formed on the surface of the $n+2^{th}$ single crystalline layer, or for the orientation of undulations formed on the surface of the nth layer in the form of the substrate or a single crystalline layer to be perpendicular to the orientation of undulations formed on the surface of the $n+1^{th}$ single crystalline layer and for the orientation of undulations formed on the surface of the $n+1^{th}$ single crystalline layer to be identical to undulations formed on the surface of the $n+2^{th}$ single crystalline layer.

In all of these cases, the orientation of the steps and terraces that are formed and the orientation of polarity change, and thus it is possible to forcefully change the direction of growth to inhibit planar defects from propagating to the growth surface. The effect of eliminating planar defects is increased and a crystal layer with fewer defects is obtained.

According to the manufacturing method of the present invention, it is possible to obtain silicon carbide of low defect density. By eliminating planar defects propagating from the boundary, it is possible to reduce the generation of leak currents and the like among various electric characteristics, and thus achieve a practical semiconductor material.

Further, according to the manufacturing method of the present invention, it is possible to obtain compound crystals such as gallium nitride on silicon carbide or aluminum nitride on silicon carbide of low defect density.

Still further, according to the manufacturing method of the present invention, it is possible to achieve hexagonal compound crystals. That is, it is possible to achieve low defect-density hexagonal silicon carbide, hexagonal gallium nitride, and aluminum nitride.

Still further, according to the manufacturing method of the present invention, it is possible to obtain high-quality compound crystals having a planar defect density equal to or less than 1/cm. Based on the present invention, it is possible to obtain compound crystals suitable for use as semiconductor materials.

EXAMPLES

The present invention is described in greater detail below through examples.

Example 1

Undulations parallel in the <110> direction were formed on a Si (001) substrate surface six inches in diameter by rubbing an abrasive parallel to the <110> direction to obtain a substrate. The abrasives employed were commercially available diamond slurry about 9 micrometers in diameter (Hipress made by Engis Co.) and commercially available abrasive cloth (Engis M414). The cloth was impregnated with diamond slurry uniformly, the Si (001) substrate was placed on the pad, a pressure of 0.2 kg/cm$^2$ was applied over the entire Si (001) substrate, and the substrate was run about 300 times back and forth over the cloth over a distance of about 20 cm parallel to the <110> direction (single direction grinding processing). Countless abrasive striations (undulations) were formed on the Si (001) substrate surface parallel to the <110> direction.

Because grinding abrasive and the like had adhered to the surface of the Si (001) substrate during the single direction grinding treatment, it was cleaned with an ultrasound cleaning system and then washed with a mixed solution of hydrogen peroxide aqueous solution and sulfuric acid (1:1), and with an HF solution. After washing, a heat treatment furnace was employed to form a thermal oxidation film of about 1 micrometer on the undulation-processed substrate under the conditions shown in Table 1. The thermal oxidation film was removed with diluted hydrofluoric acid. Large numbers of irregularities on fine spikes and defects were present on the substrate surface in addition to the desired undulations and it was difficult to employ the substrate used for growth. However, a thermal oxidation film of about 1 micrometer was formed and the oxide film was then removed to etch the substrate surface by about 2000 Angstroms, removing the minute irregularities and yielding extremely smooth undulations. A look at the cross-section of the waveform revealed the waveform irregularities to be irregular and unstable in size, but high in density. They were always in a continuously undulating state. The depth of the channels was 30 to 50 nm and the width thereof was 1 to 2 micrometers. The gradient of slope was 3 to 5°.

TABLE 1

| Equipment | Atmospheric pressure heat treatment furnace (hot wall type) |
|---|---|
| Temperature | 1,000 to 1,200° C. |
| Oxygen flow rate | 1 to 5 slm (100 to 1,000 sccm steam) |
| Diluting gas (argon) flow rate | 1 to 5 slm |
| Processing time | 3 hours |

Silicon carbide (3C—SiC) was formed by vapor phase growth on the substrate obtained by the above-described method. The growing conditions are given in Tables 2 and 3.

TABLE 2

| Carbonization temperature | 1,000 to 1,400° C. |
|---|---|
| Acetylene flow rate | 10 to 50 sccm |
| Pressure | 20 to 90 mTorr |
| Time for raising temperature | 30 to 120 min. |

TABLE 3

| Growth temperature | 1,000 to 1,400° C. |
|---|---|
| Method for feeding gas | Alternatively feeding of acetylene and dichlorosilane |
| Acetylene flow rate | 10 to 50 sccm |
| Dichlorosilane flow rate | 10 to 500 sccm |
| Interval of feeding each gas | 1 to 5 sec. |
| Feeding time of each gas | 1 to 5 sec. |
| Maximum pressure | 100 mTorr |
| Minimum pressure | 10 mTorr |

3C—SiC was grown while alternately feeding dichlorosilane and acetylene into a reaction tube, yielding 3C—SiC with a plate thickness of about 200 micrometers on an Si substrate that had been treated to impart undulations. The surface was smooth and had a mirror finish. The shape of the undulations on the base substrate did not appear on the surface.

The etch pit density and twin density of the 3C—SiC obtained were determined by the following methods.

The 3C—SiC was exposed to molten KOH (500° C., 5 min) and the surface was observed with an optical microscope, revealing 1,290 etch pits such as stacking defects and planar defects (twins, APBs) over the entire six-inch surface, or $7.3/cm^2$. An X-ray diffraction rocking curve (XRD) pole figure of the 3C—SiC (111) face was prepared and the twin density was calculated from the ratio of the signal intensity in the orientation of $\{115\}$ faces corresponding to twin planes to the signal intensity in the orientation of $\{111\}$ faces of a normal single crystalline surface. The result revealed the twin density to be $3 \times 10^{-3}$ Vol. %.

Undulations identical to the undulations formed on the Si substrate were then formed on the 3C—SiC obtained above. The method of formation was identical in all respects to that described above. The direction of extension of the undulations was parallel to the <110> orientation. 3C—SiC was then homoepitaxially grown to a thickness of 100 micrometers on the undulation-processed 3C—SiC.

The etch pit density and twin density of the 3C—SiC obtained were calculated as set forth below.

The 3C—SiC was exposed to molten KOH (500° C., 5 min) and the surface was observed with an optical microscope, revealing 420 etch pits such as stacking defects and planar defects (twins, APBs) over the entire six-inch surface, or $2.4/cm^2$. An X-ray diffraction rocking curve (XRD) pole figure of the 3C—SiC (111) face was prepared and the twin density was calculated from the ratio of the signal intensity in the orientation of $\{115\}$ faces corresponding to twin planes to the signal intensity in the orientation of $\{111\}$ faces of a normal single crystalline surface. The result revealed the twin density to be equal to or less than $4 \times 10^{-4}$ Vol. % which was a measurement limit.

For comparison, the formation of 3C—SiC was continued to a thickness of 300 micrometers on the undulation-processed Si substrate. This 3C—SiC was exposed to molten KOH (500° C., 5 min) and the surface was observed with an optical microscope, revealing 900 etch pits such as stacking defects and planar defects (twins, APBs) over the entire six-inch surface, or $5.1/cm^2$. An X-ray diffraction rocking curve (XRD) pole figure of the 3C—SiC (III) face was prepared and the twin density was calculated from the ratio of the signal intensity in the orientation of $\{115\}$ faces corresponding to twin planes to the signal intensity in the orientation of $\{111\}$ faces of a normal single crystalline surface. The result revealed the twin density to be equal to or less than $2 \times 10^{-3}$ Vol. %.

These results reveal that the undulation treatment of the surfaces of grown layers followed by growth of 3C—SiC thereover quickly eliminated planar defects propagating from the substrate boundary toward the surface of the growth layer.

Example 2

Undulations parallel to the <110> direction were formed on a Si (001) substrate surface six inches in diameter by rubbing an abrasive parallel to the <110> direction to obtain a substrate. The abrasives employed were commercially available diamond slurry about 9 micrometers in diameter (Hipress made by Engis Co.) and commercially available abrasive cloth (Engis M414). The cloth was impregnated with diamond slurry uniformly, the Si (001) substrate was placed on the pad, a pressure of $0.2 \text{ kg/cm}^2$ was applied over the entire Si (001) substrate, and the substrate was run about 300 times back and forth over the cloth over a distance of about 20 cm parallel to the <110> direction (single direction grinding processing). Countless abrasive striations (undulations) were formed on the Si (001) substrate surface parallel to the <110> direction.

Because grinding abrasive and the like had adhered to the surface of the Si (001) substrate during the single direction grinding treatment, it was cleaned with an ultrasound cleaning system and then washed with a mixed solution of hydrogen peroxide aqueous solution and sulfuric acid (1:1), and with an HF solution. After washing, a heat treatment furnace was employed to form a thermal oxidation film of about 1 micrometer on the undulation-processed substrate under the conditions shown in the table. The thermal oxidation film formed was removed with diluted hydrofluoric acid. Large numbers of irregularities on fine spikes and defects were present on the substrate surface in addition to the desired undulations and it was difficult to employ the substrate used for growth. However, a thermal oxidation film of about 1 micrometer was formed and the oxide film was then removed to etch the substrate surface by about 2000 Angstroms, removing the minute irregularities and yielding extremely smooth undulations. A look at the cross-section of the waveform revealed the waveform irregularities to be irregular and unstable in size, but high in density. They were always in a continuously undulating state. The depth of the channels was 30 to 50 nm and the width thereof was 1 to 2 micrometers. The gradient of slope varied, but was roughly 3 to 5°.

3C—SiC was grown to a thickness of 200 micrometers on the undulation-processed Si (001) substrate that had been prepared. The formation conditions were as indicated in Tables 2 and 3.

The surface of the 3C—SiC obtained was processed to impart undulations. The direction of extension of the undulations was parallel to the <1–10> direction. That is, it was perpendicular to the direction of extension of the undulations formed on the base substrate when the sample was viewed from the <001> orientation.

3C—SiC was homoepitaxially grown to a thickness of 100 micrometers on the 3C—SiC obtained. The growth method was identical to the method described above.

The etch pit density and twin density of the 3C—SiC obtained were obtained as set forth below.

The 3C—SiC was exposed to molten KOH (500° C., 5 min) and the surface was observed with an optical microscope, revealing 380 etch pits such as stacking defects and planar defects (twins, APBs) over the entire six-inch surface, or $2.2/cm^2$. An X-ray diffraction rocking curve (XRD) pole figure of the 3C—SiC (111) plane was prepared and the twin density was calculated from the ratio of the signal intensity in the orientation of {115} faces corresponding to twin planes to the signal intensity in the orientation of {111} faces of a normal single crystalline surface. The results revealed the twin density to be equal to or less than $4 \times 10^{-4}$ Vol. %.

Example 3

The 3C—SiC obtained in Example 2 was undulation treated in the present example. The method of treatment was identical to that in Example 2.3C—SiC was then epitaxially grown to a thickness of 100 micrometers on the surface of the undulation-processed 3C—SiC. The growth method was identical to that in Example 2.

The etch pit density and twin density of the 3C—SiC obtained were obtained as set forth below.

The 3C—SiC was exposed to molten KOH (500° C., 5 min) and the surface was observed with an optical microscope, revealing 240 etch pits such as stacking defects and planar defects (twins, APBs) over the entire six-inch surface, or $1.36/cm^2$. An X-ray diffraction rocking curve (XRD) pole figure of the 3C—SiC <111> orientation was prepared and the twin density was calculated from the ratio of the signal intensity in the orientation of {115} faces corresponding to twin planes to the signal intensity in the orientation of {111} faces of a normal single crystalline surface. The result revealed the twin density to be equal to or less than $4 \times 10^{-4}$ Vol. % which was a measurement limit.

Example 4

Undulations parallel in the <110> direction were formed on a Si (001) substrate surface six inches in diameter by rubbing an abrasive parallel to the <110> direction to obtain a substrate. The abrasives employed were commercially available diamond slurry about 9 micrometers in diameter (Hipress made by Engis Co.) and commercially available abrasive cloth (Engis M414). The cloth was impregnated with diamond slurry uniformly, the Si (001) substrate was placed on the pad, a pressure of $0.2$ kg/cm$^2$ was applied over the entire Si (001) substrate, and the substrate was run about 300 times back and forth over the cloth over a distance of about 20 cm parallel to the <110> direction (single direction grinding processing). Countless abrasive striations (undulations) were formed on the Si (001) substrate surface parallel to the <110> direction.

Because grinding abrasive and the like had adhered to the surface of the Si (001) substrate during the single direction grinding treatment, it was cleaned with an ultrasound cleaning system and then washed with a mixed solution of hydrogen peroxide aqueous solution and sulfuric acid (1:1), and with an HF solution. After washing, a heat treatment furnace was employed to form a thermal oxidation film of about 1 micrometer on the undulation-processed substrate under the conditions shown in the table. The thermal oxidation film prepared was removed with diluted hydrofluoric acid. Large numbers of irregularities on fine spikes and defects were present on the substrate surface in addition to the desired undulations and it was difficult to employ the substrate used for growth. However, a thermal oxidation film of about 1 micrometer was formed and the oxide film was then removed to etch the substrate surface by about 2000 Angstroms, removing the minute irregularities and yielding extremely smooth undulations. A look at the cross-section of the waveform revealed the waveform irregularities to be irregular and unstable in size, but high in density. They were always in a continuously undulating state. The depth of the channels was 30 to 50 nm and the width thereof was 1 to 2 micrometers. The gradient of slope was 3 to 5°.

Silicon carbide (3C—SiC) was formed by vapor phase growth on the substrate obtained by the above-described method. The growing conditions are given in Tables 2 and 3.

3C—SiC was grown while alternately feeding dichlorosilane and acetylene into a reaction tube, yielding 3C—SiC with a plate thickness of about 200 micrometers on the undulation-processed Si substrate. The surface was smooth and had a mirror finish. The shape of the undulations on the base substrate did not appear on the surface.

The etch pit density and twin density of the 3C—SiC obtained were determined by the following methods.

The 3C—SiC was exposed to molten KOH (500° C., 5 min) and the surface was observed with an optical microscope, revealing 1,290 etch pits such as stacking defects and planar defects (twins, APBs) over the entire six-inch surface, or $7.3/cm^2$. An observation by X-ray diffraction rocking curve (XRD) pole to figure of the 3C—SiC <111> orientation was conducted and the twin density was calculated from the ratio of the signal intensity in the orientation of {115} faces corresponding to twin planes to the signal intensity in the orientation of {111} faces of a normal single crystalline surface. The result revealed the twin density to be $3 \times 10^{-3}$ Vol. %.

The 3C—SiC obtained above was treated to impart undulation and gallium nitride (GaN) was formed. An organic metal chemical vapor deposition (MOCVD) equipment was employed to feed trimethylgallium and ammonia, forming GaN. The growth temperature was 1,100° C. As a carrier gas, nitrogen was fed at 20 slm, ammonia (NH$_3$) was fed at 10 slm, and trimethylgallium was fed at $1 \times 10^{-4}$ mol/min. The film thickness was about 10 micrometers.

The twin density of the GaN obtained was calculated as follows.

An X-ray diffraction rocking curve (XRD) pole figure of the GaN (111) face was prepared and the twin density was calculated from the ratio of the signal intensity in the orientation of {115} faces corresponding to twin planes to the signal intensity in the orientation of {111} faces of a normal single crystalline surface. The result revealed the twin density to be equal to or less than $4 \times 10^{-4}$ Vol. % which was a measurement limit.

As a comparison example, GaN was grown over the 3C—SiC which had not been subjected to undulation-processing. The growth method was identical to that described above. The defect density of the GaN obtained was calculated as follows. An X-ray diffraction rocking curve (XRD) pole figure of the GaN (111) face was prepared and the twin density was calculated from the ratio of the signal intensity in the orientation of {115} faces corresponding to twin planes to the signal intensity in the orientation of {111} faces of a normal single crystalline surface. The result revealed the twin density to be $5 \times 10^{-3}$ Vol. %.

The present invention provides a method of manufacturing compound semiconductor single crystals such as silicon carbide and gallium nitride by epitaxial growth, making it possible to obtain compound single crystals of comparatively low planer defect density.

The present disclosure relates to the subject matter contained in Japanese Patent Application No. 2001-256282 filed on Aug. 27, 2001, which is expressly incorporated herein by reference in its entirety.

What is claimed is:

1. A method of manufacturing compound single crystals in which two or more compound single crystalline layers identical to or differing from a single crystalline substrate are sequentially epitaxially grown on the surface of said substrate, characterized in that at least a portion of said substrate surface has plural undulations extending in a single direction and second and subsequent epitaxial growth is conducted after the formation of plural undulations extending in a single direction in at least a portion of the surface of the compound single crystalline layer formed proximately.

2. The method of manufacturing according to claim 1 wherein said compound single crystalline layer is a compound single crystal differing from the single crystalline substrate, and the compound single crystal constituting the compound single crystalline layer and the single crystal constituting the single crystalline substrate have similar space lattices.

3. The method of manufacturing according to claim 1 or 2 wherein the direction of the plural undulations extending on the single crystalline substrate surface and the direction of extension of the plural undulations provided on the surface of the compound single crystalline layer formed on said substrate surface are either identical or perpendicular.

4. The method of manufacturing according to claim 1 wherein the direction of extension of the plural undulations provided on the surface of the compound single crystalline layer provided adjacently to the growth direction is identical or perpendicular.

5. The method of manufacturing according to claim 1 wherein said single crystalline substrate is single crystalline SiC.

6. The method of manufacturing according to claim 1 wherein said compound single crystalline layer is single crystalline SiC, gallium nitride, aluminum nitride, or aluminum gallium nitride.

7. The method of manufacturing according to claim 1 wherein said single crystalline SiC substrate is cubic SiC in which the basal plane is the (001) face, or hexagonal SiC in which the basal plane is the (11–20) face or the (1–100) face.

* * * * *